(12) United States Patent
Chen et al.

(10) Patent No.: US 7,323,378 B2
(45) Date of Patent: Jan. 29, 2008

(54) METHOD FOR FABRICATING CMOS IMAGE SENSOR

(75) Inventors: Ching-Wei Chen, Hsin-Chu Hsien (TW); Chih-Cheng Hsieh, Hsin-Chu Hsien (TW); Chien-Chang Huang, Hsin-Chu Hsien (TW)

(73) Assignee: PixArt Imaging Inc., Hsin-Chu Hsien (TW)

( * ) Notice: Subject to any disclaimer, the term of this patent is extended or adjusted under 35 U.S.C. 154(b) by 239 days.

(21) Appl. No.: 11/163,472

(22) Filed: Oct. 20, 2005

(65) Prior Publication Data

US 2007/0092986 A1  Apr. 26, 2007

(51) Int. Cl.
*H01L 21/8238* (2006.01)
(52) U.S. Cl. .............................. 438/199; 257/E21.263
(58) Field of Classification Search ........ 438/199–202; 257/E21.632
See application file for complete search history.

(56) References Cited

U.S. PATENT DOCUMENTS

| 2006/0001059 A1 * | 1/2006 | Mouli et al. ................. 257/292 |
| 2006/0124976 A1 * | 6/2006 | Adkisson et al. ........... 257/292 |

* cited by examiner

*Primary Examiner*—Scott B. Geyer
*Assistant Examiner*—Elias Ullah
(74) *Attorney, Agent, or Firm*—Winston Hsu

(57) ABSTRACT

This invention provides a CMOS image sensor having a pinned photodiode. A P substrate is provided having thereon a P well. The P well is adjacent to a light-sensing region of the CMOS image sensor. A gate electrode of a transfer transistor of the CMOS image sensor is formed on the P well. A self-aligned implantation is performed to form N-type diode diffusion within the light-sensing region. An oblique ion implantation process is then performed to form N-type pocket diffusion directly under the gate electrode. Spacers are formed on sidewalls of the gate electrode. A surface P+ pinning diffusion region is then formed in the diode diffusion region.

10 Claims, 11 Drawing Sheets

METHOD FOR FABRICATING CMOS IMAGE SENSOR

BACKGROUND OF THE INVENTION

1. Field of the Invention

The present invention relates to a method for fabricating an image sensor and, more particularly, to a method for fabricating a CMOS image sensor integrated with a pinned photodiode, which is capable of improving fixed pattern noise, charge transfer efficiency and dynamic range thereof.

2. Description of the Prior Art

CMOS (complementary metal-oxide-semiconductor) image sensor or CMOS sensor is known in the art. Generally, a CMOS sensor includes a plurality of unit pixels having a light-sensing region and a peripheral circuit region. Each of the unit pixels also includes a light-sensing element such as a photodiode formed in the light-sensing region and a plurality of transistors formed on the peripheral circuit region. The photodiode senses incident light and accumulates image charges that are generated due to the incident light.

FIG. 1 illustrates a layout of four-transistor (4T) pixel cell 10 of a conventional CMOS sensor. FIG. 2 is a schematic, cross-sectional view of the CMOS sensor of FIG. 1 taken along line I-I'. The CMOS sensor pixel cell 10 includes a charge accumulating region 20 in an underlying portion of the substrate. A pinned diode 22 is formed in the charge accumulating region 20. A transfer gate 30 is provided for transferring photoelectric charges generated in the charge-accumulating region 20 to a floating diffusion region (sensing node) 25. The pinned photodiode is termed "pinned" because the potential in the photodiode is pinned to a constant value when the photodiode is fully depleted.

Typically, the floating diffusion region 25 is coupled to a gate 34 of a source follower transistor. The source follower transistor provides an output signal to a row select access transistor having gate 36. A reset transistor having gate 32 resets the floating diffusion region 25 to a specified charge level before each charge transfer from the charge-accumulating region 20. As best seen in FIG. 1, N-type doped source/drain regions 27 are provided on either side of the transistor gates 32, 34, 36. The floating diffusion region 25 adjacent the transfer gate 30 is also N-type.

As best seen in FIG. 2, the charge-accumulating region 20 is formed as a pinned photodiode 22, which has a PNP junction region consisting of a surface P+ pinning layer 24, an N-type photodiode region 26 and the P-type substrate 12. The pinned photodiode 22 includes two P-type regions 12, 24 so that the N-type photodiode region 26 is fully depleted at a pinning voltage. Trench isolation regions 15 are formed in the P-type substrate 12 adjacent the charge-accumulating region 20. The trench isolation regions 15 are typically formed using a conventional shallow trench isolation (STI) process or by using a local oxidation of silicon (LOCOS) process.

CMOS sensors typically suffer from poor dynamic range and poor charge transfer efficiency. As shown in FIG. 2, the overlapping area between the gate and the underlying N-type photodiode region 26 is designated as area "A". It has been known that in order to increase the charge transfer efficiency of the CMOS sensor, the overlapping area "A" should be made as large as possible. The distance between the surface P+ pinning layer 24 and the P-type substrate 12 underneath the gate 30 is designated as "B". If the distance "B" is too small, pinch-off occurs resulting in poor charge transfer, narrow dynamic range and undesirable image lags.

A conventional non-self alignment method for forming the pixel sensor can provide larger overlapping area "A" and distance "B". According to the conventional non-self-alignment method, the N-type photodiode region 26 is implanted into the pre-selected areas of the P-type substrate 12 using a photomask prior to the definition of the transfer gate 30. However, the prior art non-self-aligned method suffers from so-called fixed pattern noise due to misalignment of the lithography and non-uniformity of the overlapping area "A" among pixels.

Accordingly, there is a need in this industry to provide an improved method for fabricating CMOS sensor, which is capable of suppressing fixed pattern noise while maintaining high charge transfer efficiency and wide dynamic range.

SUMMARY OF THE INVENTION

It is therefore one object of the present invention to provide an improved method for fabricating CMOS sensor, which is capable of suppressing fixed pattern noise while maintaining high charge transfer efficiency and wide dynamic range.

According to the claimed invention, a method for fabricating a CMOS image sensor is disclosed. A semiconductor substrate of a first conductivity type is provided. A diffusion well of the first conductivity type is then implanted into the semiconductor substrate. The diffusion well is adjacent to a light-sensing region of the CMOS image sensor. A gate electrode of a transfer transistor of the CMOS image sensor is formed on the diffusion well. A self-aligned ion implantation process is performed to form a diode diffusion region of a second conductivity type in the semiconductor substrate within the light-sensing region. An oblique ion implantation process is then performed to form a pocket diffusion region of the second conductivity type in the semiconductor substrate directly under the gate electrode. A floating diffusion region of the second conductivity type is formed in the semiconductor substrate. The floating diffusion region is space-apart from the pocket diffusion region. Spacers are formed on sidewalls of the gate electrode. A surface pinning diffusion region of the first conductivity type is then formed in the diode diffusion region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is directed to an improved method for fabricating a CMOS image sensor. More specifically, the present invention pertains to a method for fabricating a CMOS pixel sensor having a pinned photodiode with improved fixed pattern noise, enhanced charge transfer efficiency and widened dynamic range thereof.

FIGS. 3-8 are schematic, cross-sectional diagrams illustrating the method for fabricating a pixel sensor of a CMOS image sensor in accordance with one preferred embodiment of this invention. The CMOS image sensor includes a plurality of unit pixels arranged in a matrix. Each unit pixel comprises a photodiode acting as a light-sensing element and four transistors. The four transistors may include a transfer transistor, a reset transistor, an amplify transistor and a select transistor. It is understood that the CMOS image sensor may have three transistors or five transistors in other cases.

Figure 1:
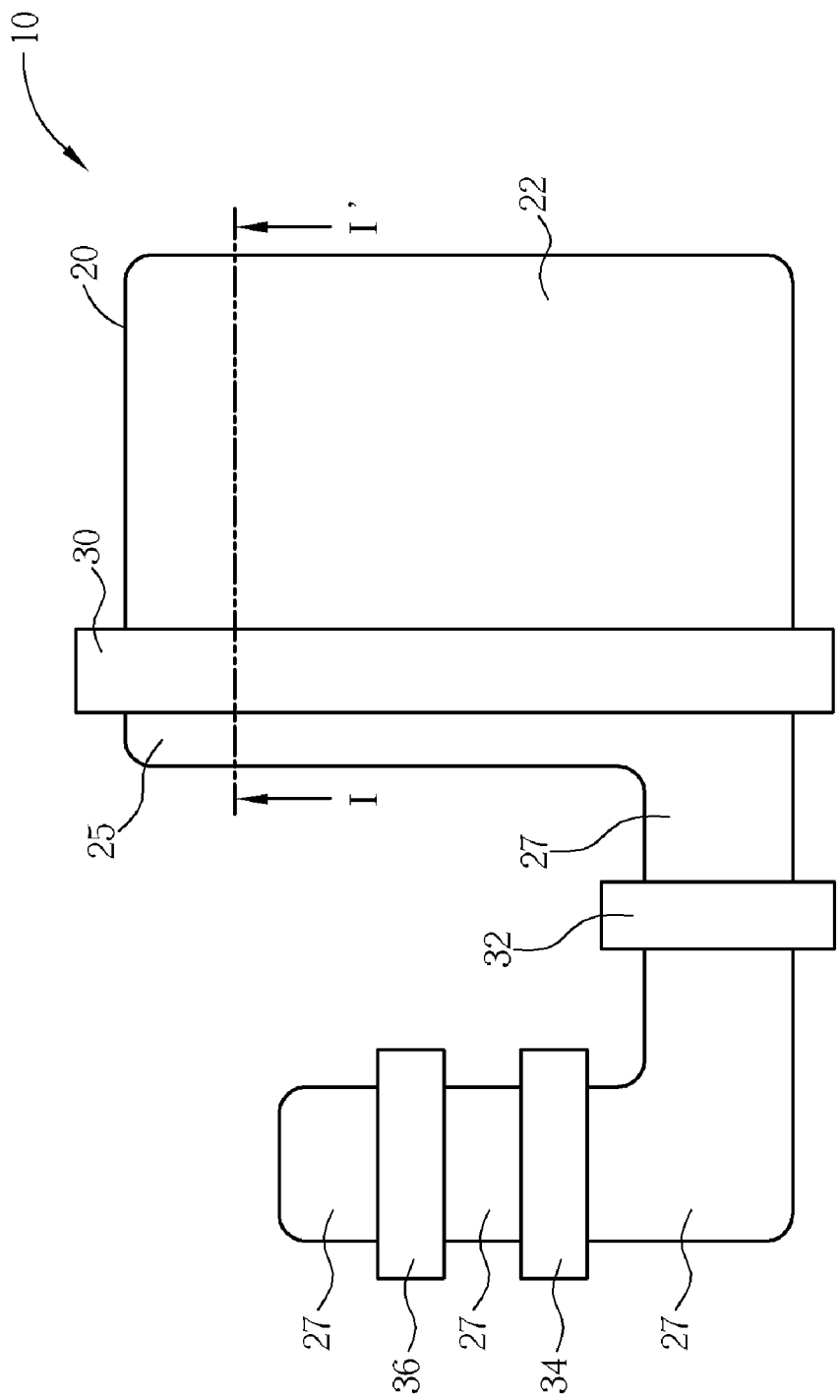
FIG. 1 illustrates a layout of four-transistor (4T) pixel cell of a conventional CMOS sensor.
Figure 2:
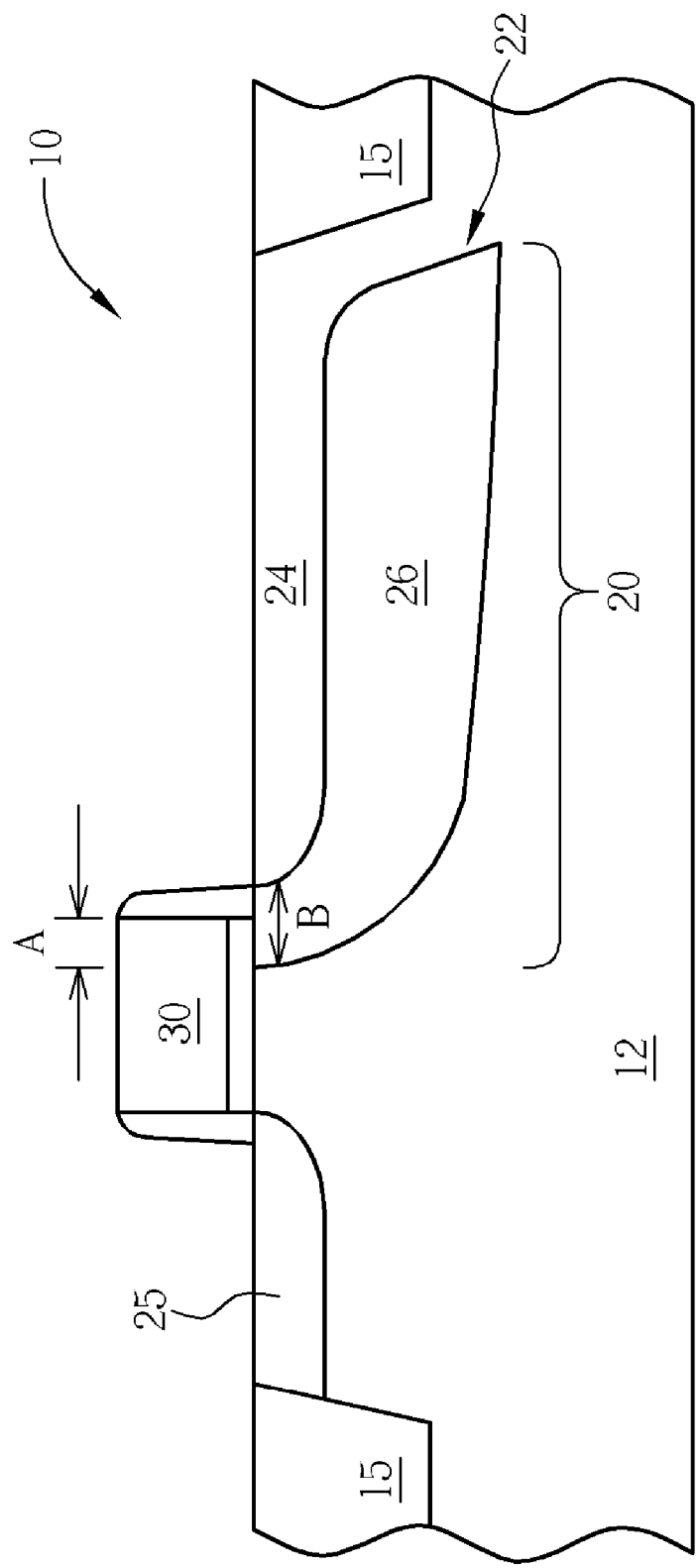
FIG. 2 is a schematic, cross-sectional view of the CMOS sensor of FIG. 1 taken along line I-I'.

The cross sections corresponding to the process steps set forth in FIGS. 3-8 are taken along line I-I' of FIG. 1, where like numeral numbers designate like elements, regions or layers. For the sake of simplicity, only the transfer transistor of the aforesaid four transistors will be shown.

Figure 3:
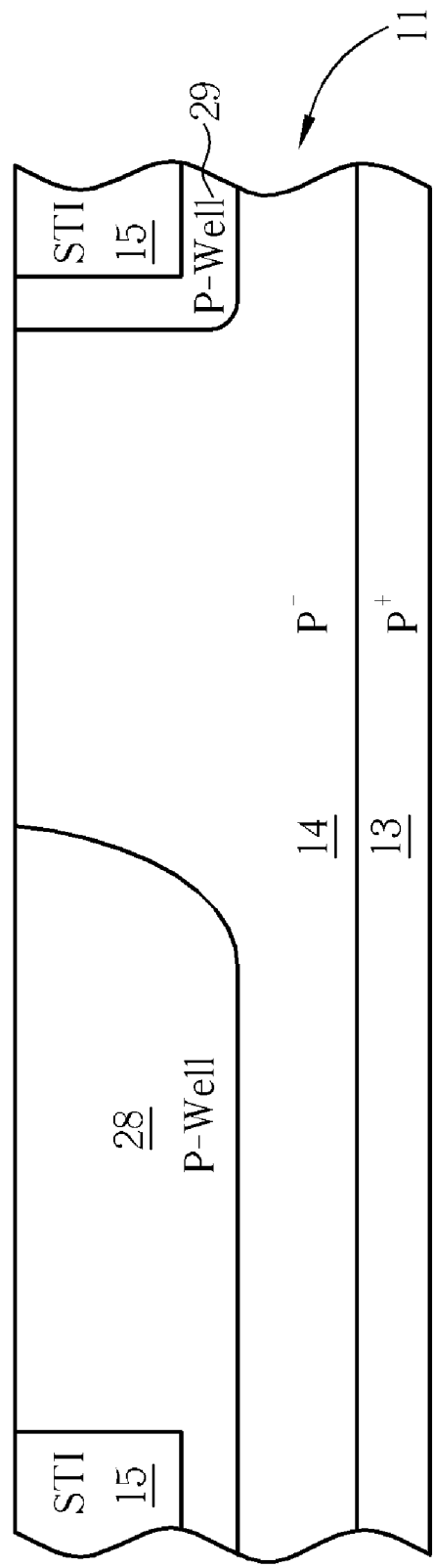
FIGS. 3-8 are schematic, cross-sectional diagrams illustrating the method for fabricating a pixel sensor of a CMOS image sensor in accordance with one preferred embodiment of this invention.

Referring initially to FIG. 3, a wafer or substrate 11 is provided. The substrate 11 comprises an active P− epitaxial silicon layer 14 that is grown on a P+ silicon substrate 13. A conventional STI (shallow trench isolation) process is carried out to form STI regions 15 on the substrate 11, more specifically, on the active P− epitaxial silicon layer 14. The STI regions 15 isolate the unit pixels one from another. By way of example, the dopant concentration in the active P− epitaxial silicon layer 14 may range between $1\times10^{14}$ and $1\times10^{17}$ atoms/cm$^3$, and is preferably between $5\times10^{14}$ and $5\times10^{16}$ atoms/cm$^3$. The dopant concentration in the P+ silicon substrate 13 may range between $1\times10^{17}$ and $1\times10^{20}$ atoms/cm$^3$, and is preferably between $5\times10^{17}$ and $5\times10^{19}$ atoms/cm$^3$.

After the formation of the STI regions 15, P-type diffusion wells 28 and 29 are implanted into the active P− epitaxial silicon layer 14. It is to be understood that the P-type diffusion wells 28 and 29 may be formed prior to the formation of the STI regions 15 in other embodiments. The P-type diffusion wells 28 and 29 encompass respective STI regions 15. It is advantageous to encompass the STI regions 15 with the P-type diffusion well 28 or 29 because it can reduce the dark current that is partly caused by the defects formed during the fabrication of the STI regions.

Figure 4:
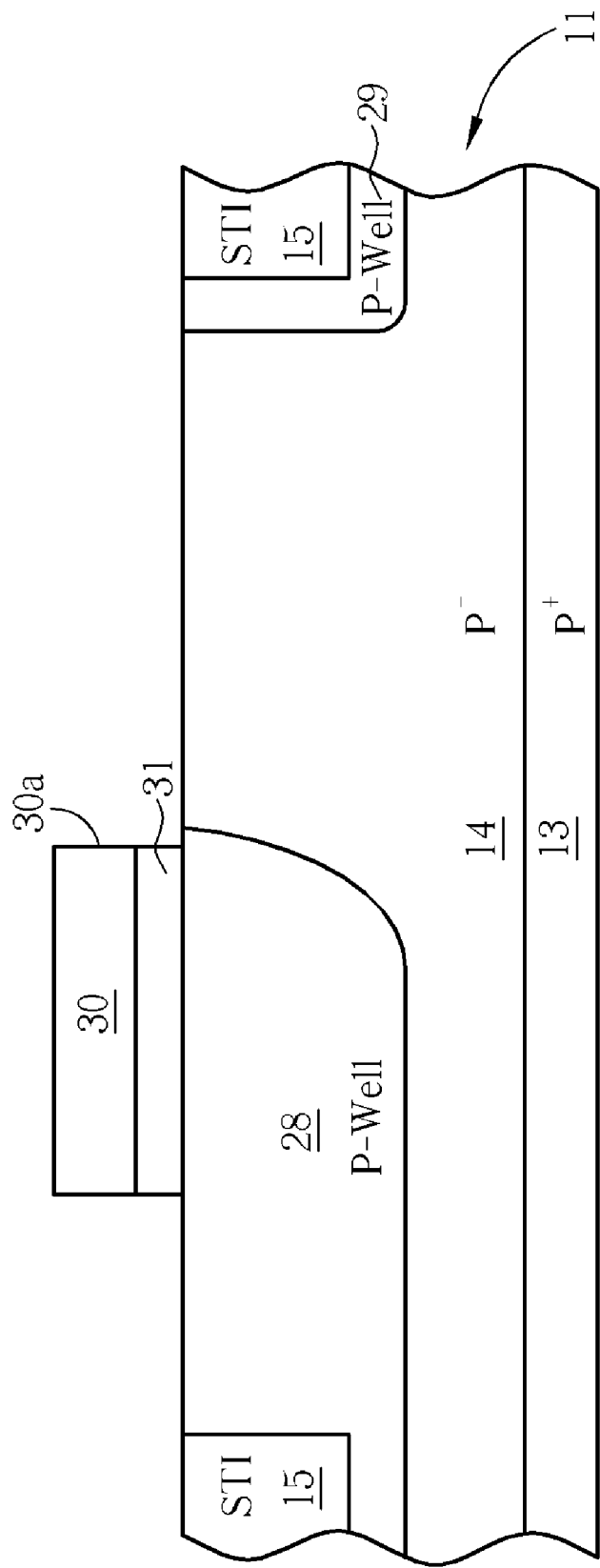

Referring to FIG. 4, after the formation of the P-type diffusion wells 28 and 29, a gate dielectric layer 31 and a gate 30 of the transfer transistor are formed on the surface of the substrate 11. The gate dielectric layer 31 is provided to isolate the gate 30 from the substrate 11. The gate dielectric layer 31 may be formed by thermal oxidation methods or chemical vapor deposition (CVD) methods. The gate 30 may be made, for example, of polysilicon, polycide or metal alloys, among others.

Figure 5:
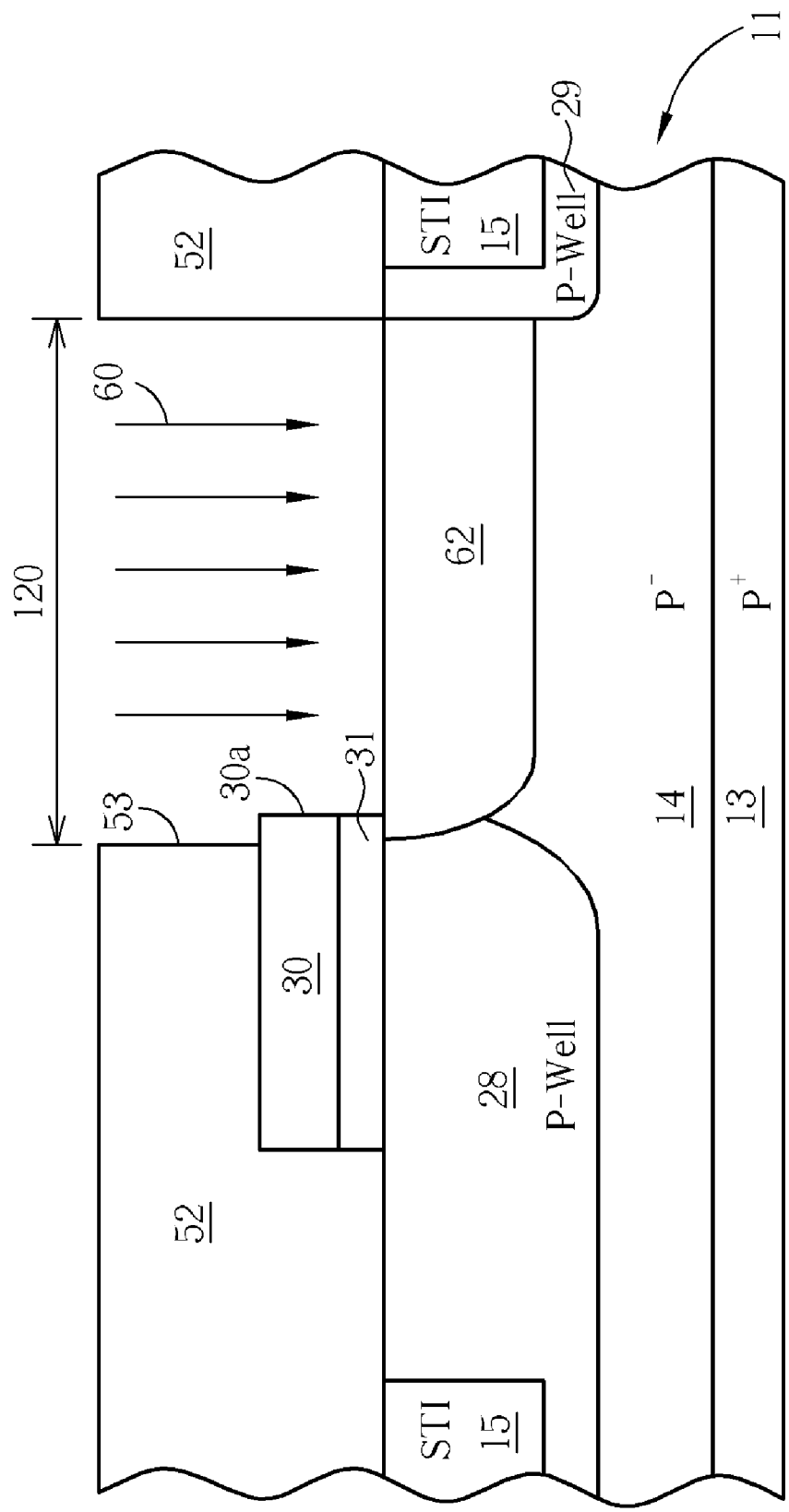

Referring to FIG. 5, a lithographic process is performed. A photoresist layer 52 is coated on the substrate 11. The photoresist layer 52 is then exposed to light and developed to form an opening 53 therein. The opening 53 exposes a portion of a light-sensing area 120 encompassed by the P wells 28 and 29. The opening 53 also exposes a portion of the gate 30 and its sidewall 30a adjacent to the light-sensing area 120. Thereafter, an ion implantation process as indicated by numeral number 60 is carried out to implant suitable N-type dopant species such as phosphorus or arsenic into the substrate 11 through the opening 53, thereby forming an N-type diffusion region 62. The dopant concentration in the N-type diffusion region 62 may range between $5\times10^{15}$ and $5\times10^{19}$ atoms/cm$^3$, and is preferably between $5\times10^{16}$ and $5\times10^{18}$ atoms/cm$^3$. The photoresist layer 52 is then stripped off.

The ion implantation process 60 is self-aligned with the exposed portion of the gate 30. By doing this, the fixed pattern noise can be reduced. In the ion implantation process 60, the direction of the incident ion species impinging on the substrate 11 is substantially normal to the surface the substrate 11. It is noteworthy that the photoresist layer 52 covers the P well 29 such that the N-type dopant species in the ion implantation process 60 are not implanted into the P well 29 substantially.

Figure 6:
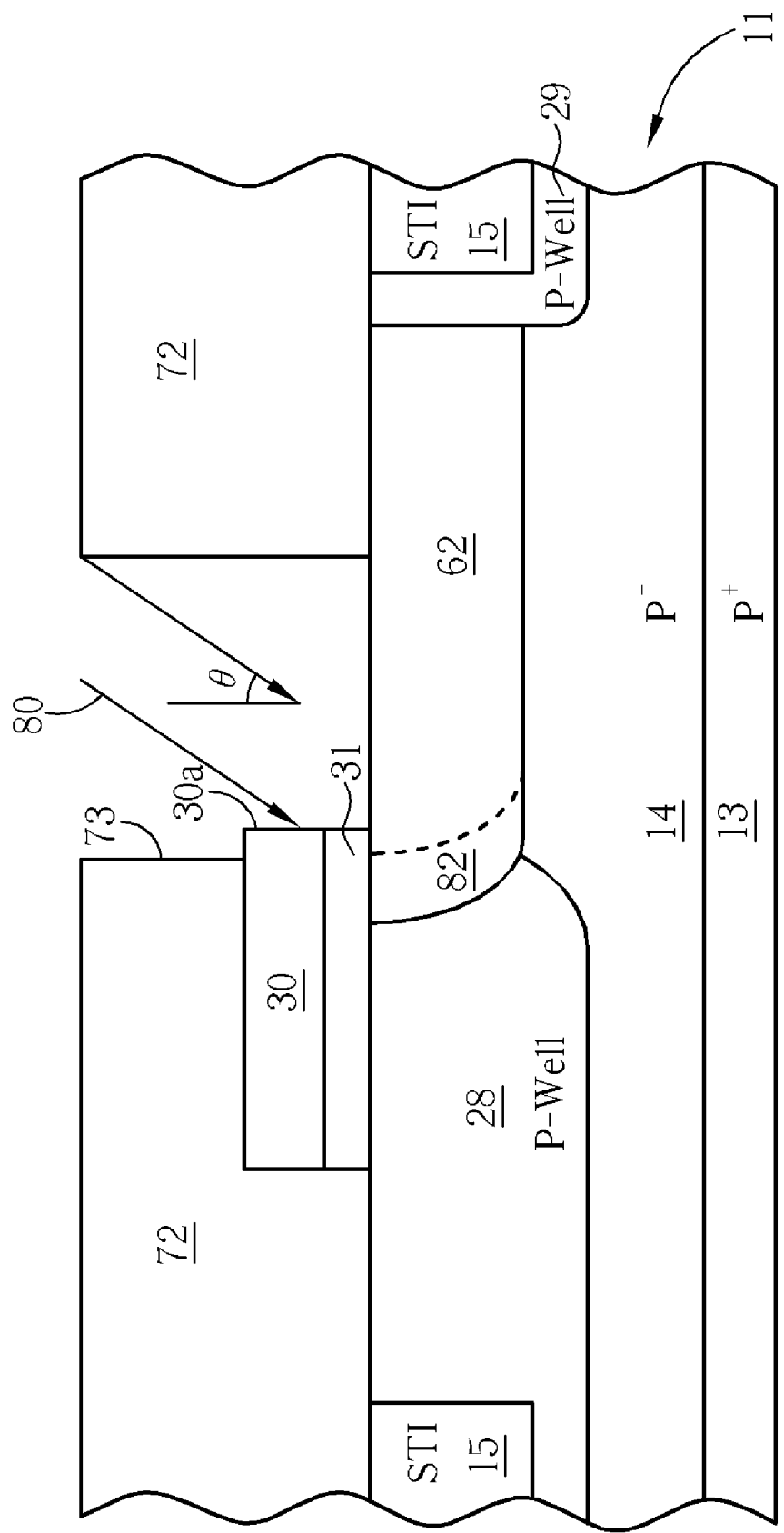

Referring to FIG. 6, after removing the photoresist layer 52, a photoresist layer 72 is coated on the substrate 11. The photoresist layer 72 is then exposed to light and developed to form an opening 73 therein. The opening 73 exposes a portion of the gate 30 and its sidewall 30a, and exposes a portion of the N-type diffusion region 62 adjacent to the sidewall 30a. Thereafter, an oblique ion implantation process as indicated by numeral number 80 is carried out to implant suitable N-type dopant species such as phosphorus or arsenic into the substrate 11 through the opening 73, thereby forming an N-type pocket region 82 that is directly under the gate 30. According to this embodiment, the N-type pocket region 82 is contiguous with the P-type diffusion well 28, but not limited thereto.

The ion implantation process 80 is self-aligned with the exposed portion of the gate 30. In the ion implantation process 80, the direction of the incident ion species impinging on the substrate 11 is not normal to the surface the substrate 11. The incident angle θ, i.e., the angle between the direction of the incident dopant species and the direction normal to the surface of the substrate, preferably range between 10 degree and 45 degree. The photoresist layer 72 is then stripped off.

Figure 7:
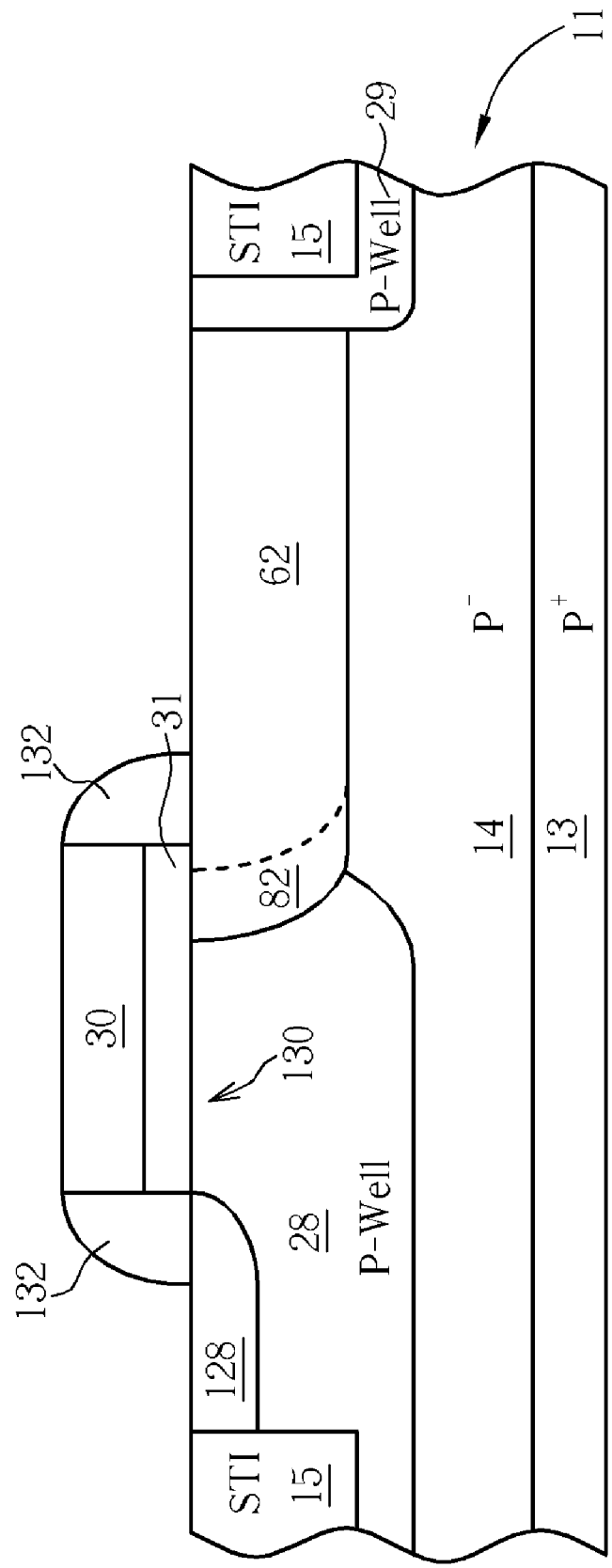

Referring to FIG. 7, spacers 132 are formed on sidewalls 30a of the gate 30. An N-type floating diffusion region 128 is implanted into the substrate 11. The N-type floating diffusion region 128 is formed in the P-type diffusion well 28 and is spaced apart from the N-type pocket region 82. A channel region 130 is formed between the N-type floating diffusion region 128 and the N-type pocket region 82. The spacers 132 may be formed by depositing a conformal insulating layer (not shown), for example, silicon oxide, over the substrate 11, and then anisotropically dry etching the insulating layer.

Figure 8:
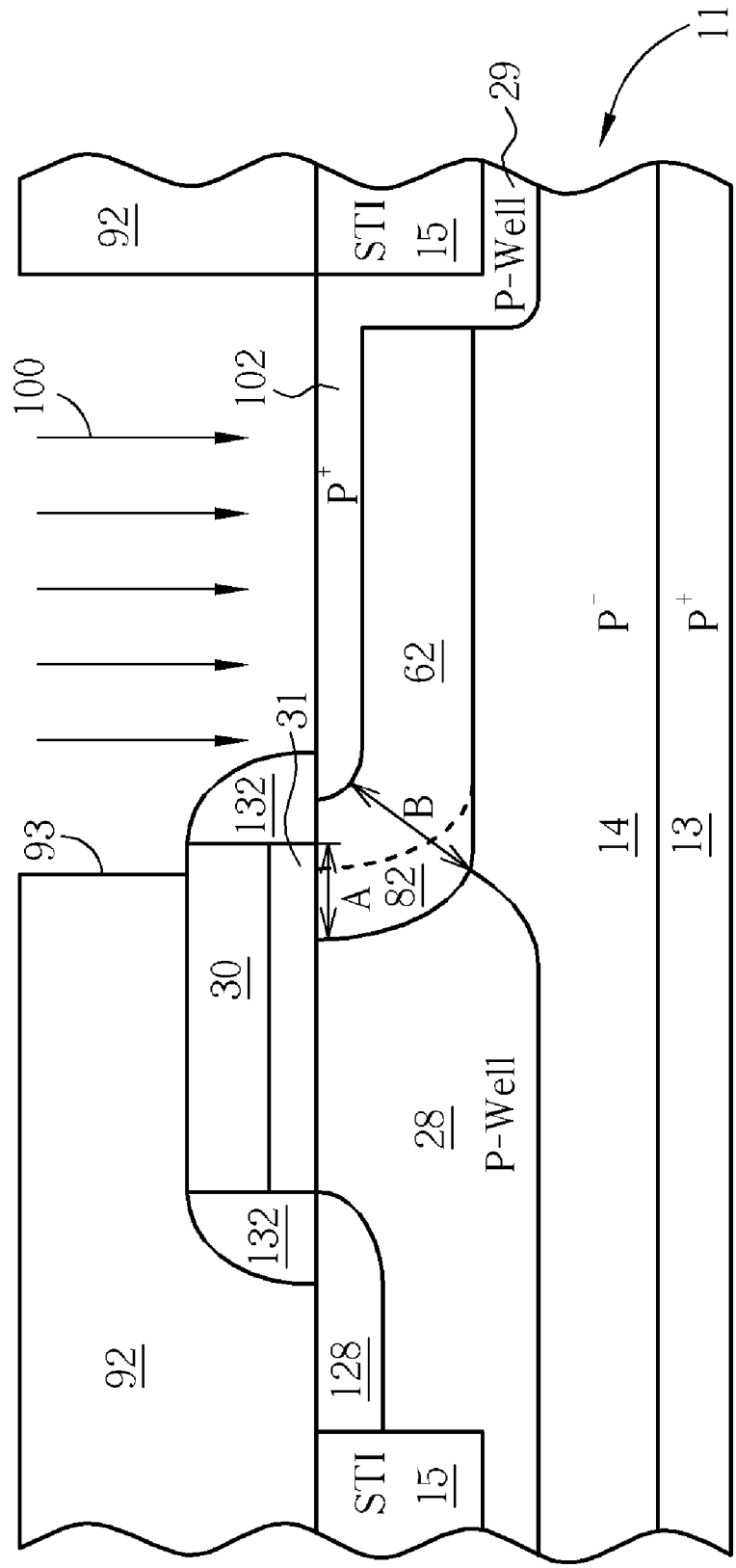

Referring to FIG. 8, after the formation of the spacers 132, a photoresist layer 92 is coated on the substrate 11. The photoresist layer 92 is then exposed to light and developed to form an opening 93 therein. The opening 93 exposes a portion of the gate 30 and spacer 132 thereof, and exposes a portion of the N-type diffusion region 62 adjacent to the spacer 132, and the P well 29. Thereafter, an ion implantation process as indicated by numeral number 100 is carried out to implant suitable P-type dopant species such as boron or BF$_2$ into the substrate 11 through the opening 93, thereby forming a surface P-type pinning region 102 that is contiguous with the P-type diffusion well 29. The dopant concentration in the surface P-type pinning region 102 may range between $1\times10^{17}$ and $1\times10^{20}$ atoms/cm$^3$, and is preferably between $5\times10^{17}$ and $5\times10^{19}$ atoms/cm$^3$. The photoresist layer 92 is then stripped off.

It is advantageous to use the present invention method because the formation of the N-type diffusion region 62 and the N-type pocket region 82 are both self-aligned with the gate 30. This reduces fixed pattern noise. Further, by forming the N-type pocket region 82 directly under the gate 30, both the overlapping area between the gate and the underlying N-type region designated as area "A" and the distance "B" between the P+ pinning layer 102 and the P well 28 underneath the gate 30 are increased. It is desirable to increase the overlapping area "A" and the distance "B" because the charge transfer efficiency and dynamic range of the CMOS sensor can thus be enhanced and image lag can also be eliminated.

It is noteworthy that the sequencing of the ion implantation process 60 and ion implantation process 80 is not important. In another embodiment, the ion implantation process 80 may be performed prior to the ion implantation process 60.

Figure 9:
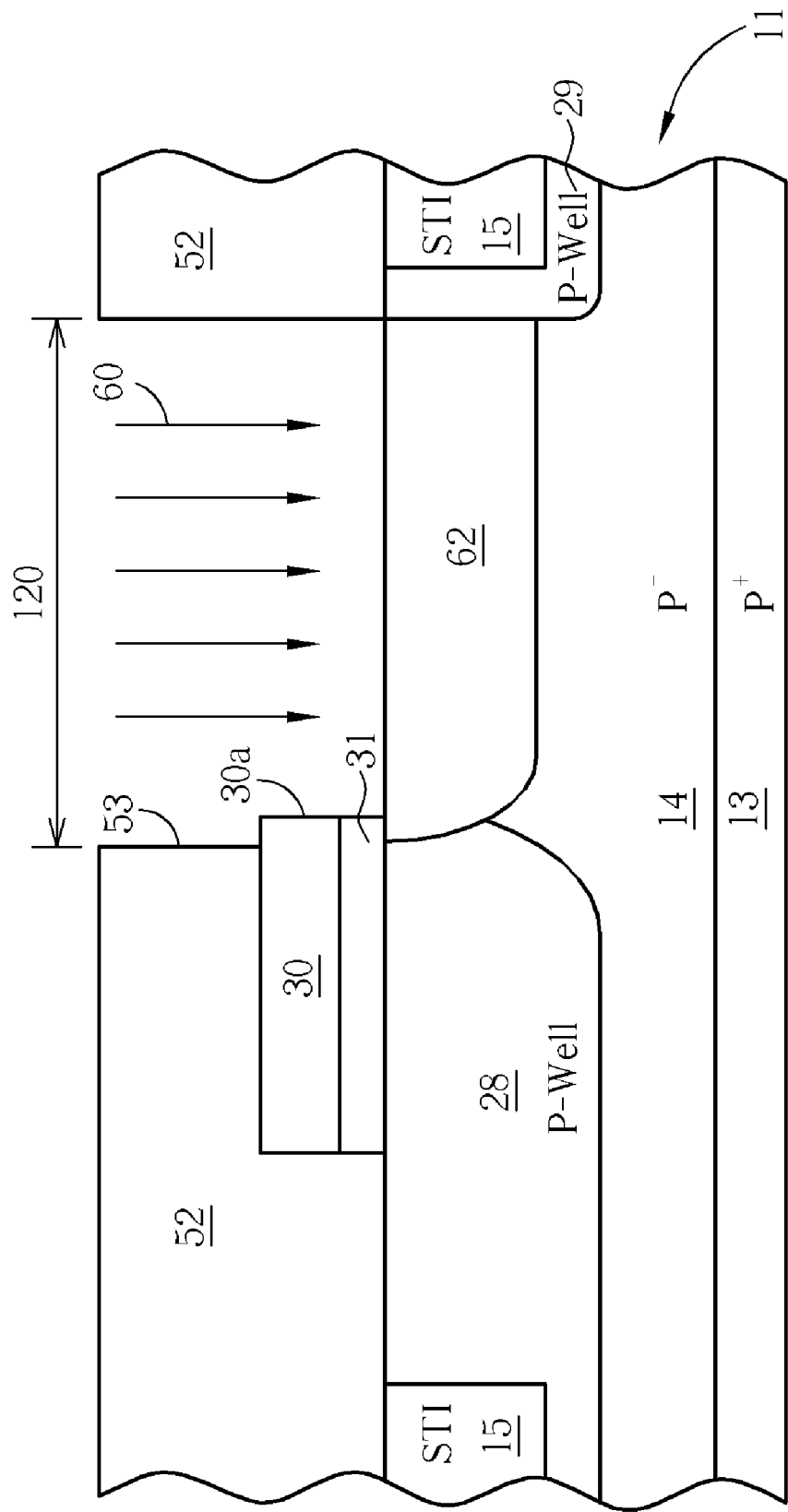
FIGS. 9-11 are schematic, cross-sectional diagrams illustrating the method for fabricating a pixel sensor of a CMOS image sensor in accordance with another preferred embodiment of this invention.
Figure 10:
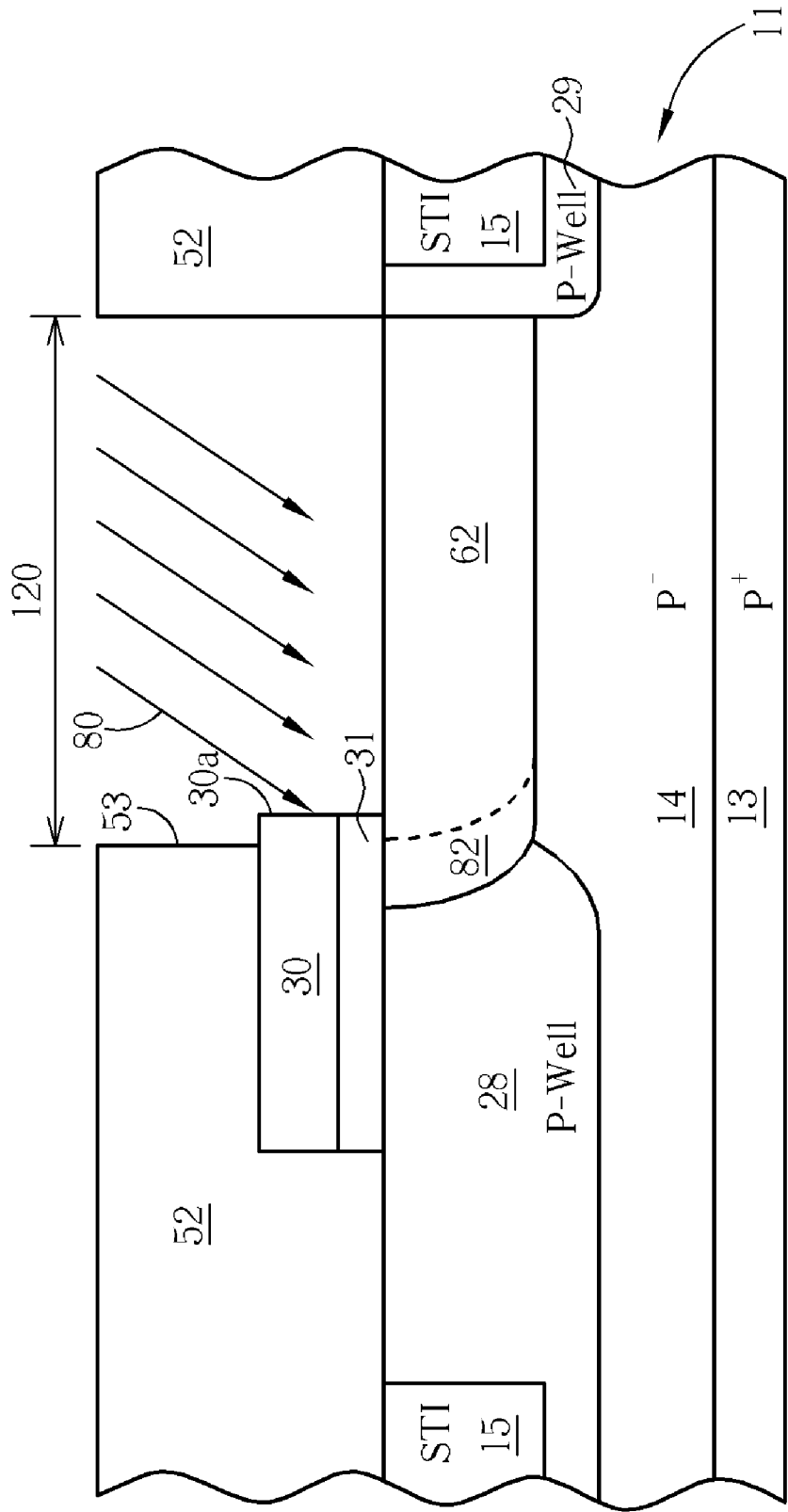
Figure 11:
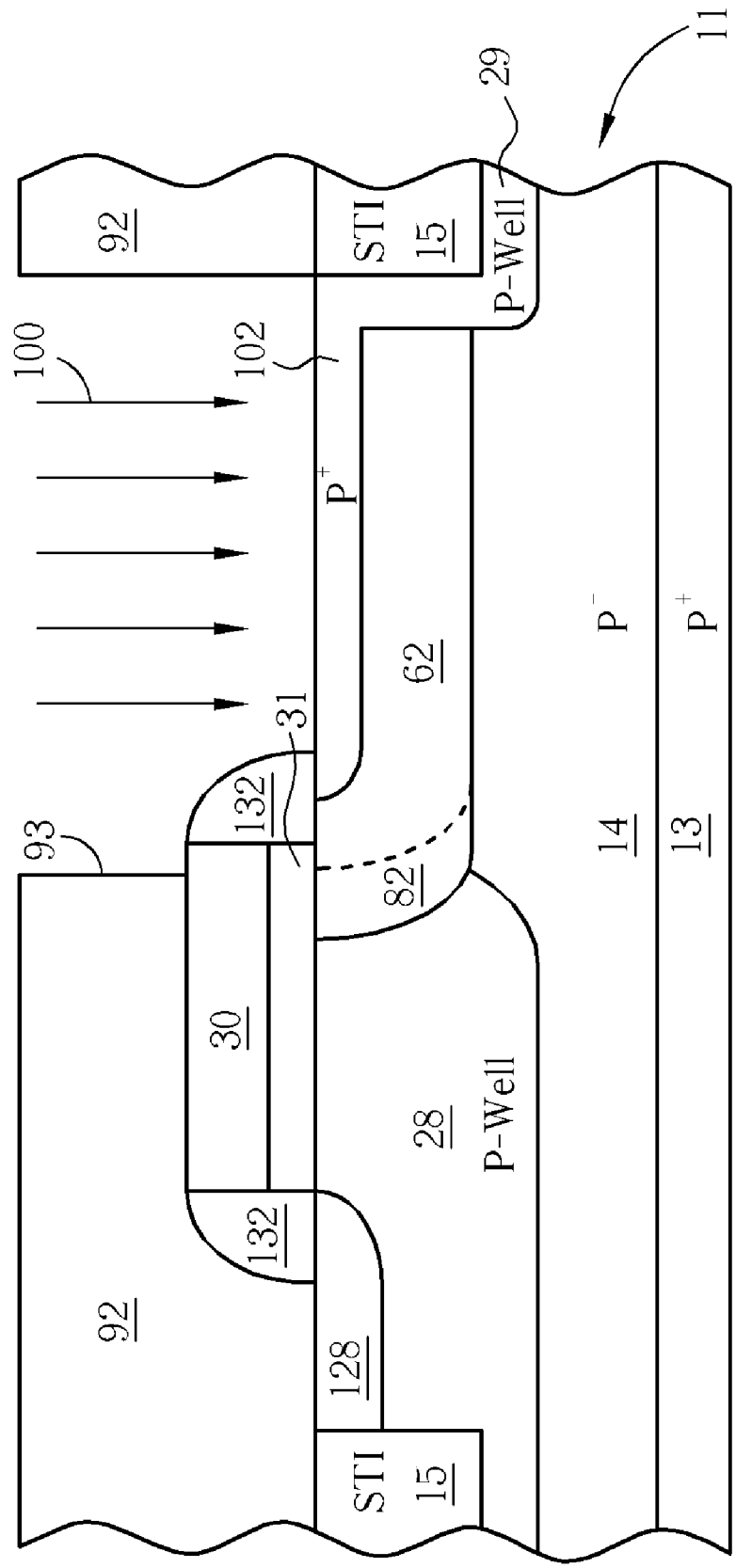

FIGS. 9-11 are schematic, cross-sectional diagrams illustrating the method for fabricating a pixel sensor of a CMOS image sensor in accordance with another preferred embodiment of this invention, wherein like numerals designate like elements, regions or layers. For the sake of simplicity, this embodiment starts with FIG. 9 that is the same as FIG. 5.

Referring to FIG. 9, a lithographic process is performed. A photoresist layer 52 is coated on the substrate 11. Likewise, the photoresist layer 52 is then exposed to light and developed to form an opening 53 therein. The opening 53 exposes a portion of a light-sensing area 120 encompassed by the P wells 28 and 29. The opening 53 also exposes a portion of the gate 30 and its sidewall 30a adjacent to the light-sensing area 120. Thereafter, a self-aligned ion implantation process as indicated by numeral number 60 is carried out to implant suitable N-type dopant species such as phosphorus or arsenic into the substrate 11 through the opening 53, thereby forming an N-type diffusion region 62.

Referring to FIG. 10, still using the photoresist layer 52 as an ion implantation mask, an oblique ion implantation process as indicated by numeral number 80 is carried out to implant suitable N-type dopant species such as phosphorus or arsenic into the substrate 11 through the opening 53, thereby forming an N-type pocket region 82 that is directly under the gate 30. The photoresist layer 52 is then stripped off.

Referring to FIG. 11, spacers 132 are formed on sidewalls 30a of the gate 30. Prior to the formation of the spacers 132, an N-type floating diffusion region 128 is implanted into the substrate 11. Thereafter, an ion implantation process 100 is carried out to implant suitable P-type dopant species such as boron or $BF_2$ into the substrate 11 through opening 93, thereby forming an P-type surface pinning region 102 that is contiguous with the P-type diffusion well 29.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a CMOS image sensor, comprising:
    providing a semiconductor substrate of a first conductivity type, said semiconductor substrate including a light-sensing region;
    forming a gate electrode of a transfer transistor of said CMOS image sensor on said semiconductor substrate, wherein an end portion of said gate electrode is adjacent to said light-sensing region;
    performing a self-aligned ion implantation process to form a diode diffusion region of a second conductivity type in said semiconductor substrate within said light-sensing region;
    performing an oblique ion implantation process to form a pocket diffusion region of said second conductivity type in said semiconductor substrate directly under said end portion of said gate electrode adjacent to said diode diffusion region;
    forming a floating diffusion region of said second conductivity type in said semiconductor substrate, said floating diffusion region being disposed at a side of said gate electrode and space-apart from said pocket diffusion region;
    after forming said diode diffusion region and said pocket diffusion region, forming spacers on sidewalls of said gate electrode; and
    forming a surface pinning diffusion region of said first conductivity type in said diode diffusion region, wherein said surface pinning diffusion region, said diode diffusion region, said pocket diffusion region and said semiconductor substrate constitute a pinned photodiode.

2. The method according to claim 1 wherein prior to forming the gate electrode of the transfer transistor, the method further comprises the following step:
    forming a diffusion well of said first conductivity type in said semiconductor substrate, said diffusion well being adjacent to said light-sensing region of said CMOS image sensor.

3. The method according to claim 1 wherein said self-aligned ion implantation process comprises the following steps:
    forming a first photoresist layer on said semiconductor substrate, wherein said first photoresist layer has a first opening that exposes a portion of said light-sensing region and a portion of said gate electrode; and
    implanting dopant species of said second conductivity type into said semiconductor substrate through said first opening, thereby forming said diode diffusion region.

4. The method according to claim 3 wherein said oblique ion implantation process comprises the following step:
    obliquely implanting dopant species of said second conductivity type into said semiconductor substrate through said first opening, thereby forming said pocket diffusion region.

5. The method according to claim 1 wherein said oblique ion implantation process comprises the following steps:
    forming a second photoresist layer on said semiconductor substrate, wherein said second photoresist layer has a second opening that exposes a portion of said light-sensing region and a portion of said gate electrode; and
    obliquely implanting dopant species of said second conductivity type into said semiconductor substrate through said second opening, thereby forming said pocket diffusion region.

6. The method according to claim 1 wherein said first conductivity type is P type and said second conductivity type is N type.

7. The method according to claim 1 wherein said spacers are formed by depositing a conformal insulating layer over said semiconductor substrate, and then anisotropically dry etching said insulating layer.

8. The method according to claim 1 wherein prior to forming said gate electrode, a gate dielectric layer is formed on said semiconductor substrate, and said gate electrode is stacked on said gate dielectric layer.

9. The method according to claim 1 wherein said gate electrode comprises polysilicon, polycide and metal alloys.

10. The method according to claim 1 wherein said CMOS image sensor comprises four transistors.

* * * * *